(12) United States Patent
Kim et al.

(10) Patent No.: US 10,797,802 B2
(45) Date of Patent: Oct. 6, 2020

(54) OPTICAL RECEIVER

(71) Applicants: Sk hynix Inc., Icheon (KR); KOREA UNIVERSITY RESEARCH AND BUSINESS FOUNDATION, Seoul (KR)

(72) Inventors: Chul Woo Kim, Seoul (KR); Hyun Su Park, Seoul (KR); Jin Cheol Sim, Seoul (KR); Choong Hwan Lee, Seoul (KR)

(73) Assignees: SK hynix Inc., Icheon (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/362,066

(22) Filed: Mar. 22, 2019

(65) Prior Publication Data
US 2020/0052796 A1 Feb. 13, 2020

(30) Foreign Application Priority Data
Aug. 9, 2018 (KR) .................. 10-2018-0092845

(51) Int. Cl.
*H04B 10/69* (2013.01)
*H03F 3/08* (2006.01)
(Continued)

(52) U.S. Cl.
CPC ......... *H04B 10/6931* (2013.01); *H03F 3/082* (2013.01); *H03K 5/13* (2013.01);
(Continued)

(58) Field of Classification Search
CPC .................. H03F 3/082; H03F 3/3022; H03K 2005/00156; H03K 5/13; H04B 10/673; H04B 10/6931; H04B 10/6932
(Continued)

(56) References Cited

U.S. PATENT DOCUMENTS

| 6,596,439 B1 * | 7/2003 | Tsukamoto | ............ A61N 1/378 |
| | | | 429/223 |
| 6,956,439 B1 * | 10/2005 | Devnath | ................... H03F 1/26 |
| | | | 330/259 |

(Continued)

FOREIGN PATENT DOCUMENTS

| KR | 20140118599 A | 10/2014 |
| KR | 2016011751 A | 2/2016 |
| KR | 20160095556 A | 8/2016 |

*Primary Examiner* — Amritbir K Sandhu

(57) ABSTRACT

An optical receiver includes a transimpedance amplifier that converts a current signal corresponding to an optical signal into a voltage signal. The transimpedance amplifier includes an input terminal receiving the current signal, an output terminal outputting the voltage signal, an inverting circuit including a pull-up device that pull-up drives the voltage signal of the output terminal according to the current signal, and a pull-down device that pull-down drives the voltage signal of the output terminal according to the current signal, a feedback resistor electrically connected between the input and output terminals, a first resistor electrically connected between the input terminal and the pull-up device, and a second resistor electrically connected between the input terminal and the pull-down device.

20 Claims, 7 Drawing Sheets

(51) Int. Cl.
*H04B 10/67* (2013.01)
*H03K 5/13* (2014.01)
*H03K 5/00* (2006.01)

(52) U.S. Cl.
CPC ....... *H04B 10/673* (2013.01); *H04B 10/6932* (2013.01); *H03K 2005/00156* (2013.01)

(58) Field of Classification Search
USPC .................................................. 398/202–214
See application file for complete search history.

(56) References Cited

U.S. PATENT DOCUMENTS

| | | | | |
|---|---|---|---|---|
| 7,454,190 B2* | 11/2008 | Schrodinger | ........ | H04B 10/693 330/98 |
| 7,525,391 B2* | 4/2009 | Denoyer | ................ | H03F 3/08 330/308 |
| 8,139,957 B2* | 3/2012 | Bowler | ................ | H03F 1/48 250/214 A |
| 8,471,639 B2* | 6/2013 | Welch | ................ | H03F 1/34 330/308 |
| 8,593,226 B2* | 11/2013 | Proesel | ................ | H03F 3/08 330/308 |
| 8,896,950 B1* | 11/2014 | Polley | ................ | G11B 5/6011 360/46 |
| 9,490,757 B2* | 11/2016 | Frank | ................ | H03F 3/082 |
| 9,571,045 B2* | 2/2017 | Frank | ................ | H03F 1/42 |
| 10,367,591 B2* | 7/2019 | Raj | ................ | H04B 17/18 |
| 2002/0105385 A1* | 8/2002 | Buescher | ................ | H03G 1/0023 330/308 |
| 2004/0036536 A1* | 2/2004 | Gupta | ................ | H03F 3/45748 330/308 |
| 2008/0192555 A1* | 8/2008 | Fort | ................ | G11C 7/067 365/207 |
| 2014/0016949 A1* | 1/2014 | Koizumi | ................ | H04B 10/60 398/212 |
| 2015/0311982 A1* | 10/2015 | Georgas | ................ | H04B 10/25891 398/212 |
| 2018/0294883 A1* | 10/2018 | Kim | ................ | H04B 10/69 |

* cited by examiner $A_0$ : LA 1 stage gain
$t_d$ : LA 1 stage delay
$\alpha$ : Resistance dividing ratio

OPTICAL RECEIVER

CROSS-REFERENCE TO RELATED APPLICATION

This application claims priority under 35 U.S.C. § 119 to Korean Patent Application No. 10-2018-0092845 filed on Aug. 9, 2018, which is incorporated herein by reference in its entirety.

BACKGROUND

1. Field

Exemplary embodiments relate to optical communication technology, and more particularly, to technology for improving a bandwidth of an optical receiver.

2. Discussion of the Related Art

Recently, as the traffic of a data communication network is continuously increasing, an optical receiver having a large capacity is demanded to deal with the increasing traffic. Therefore, various efforts have been made to increase a transmission capacity and to process more data. It is necessary to develop an optical receiver having a wider bandwidth.

An optical receiver is an apparatus that converts a received optical signal into an electrical signal, and the optical receiver may include a transimpedance amplifier and a limiting amplifier.

In the related art, an optical receiver uses inductive peaking technology in which an inductor is employed in a transimpedance amplifier and a limiting amplifier in order to increase a bandwidth. However, since the inductor, which is a passive device used in the technology, occupies most of a chip area, there is a problem that the inductor greatly increases the chip area.

Particularly, since the limiting amplifier is designed in a multistage configuration, when the inductor is used in each stage of the multistage configuration, there is a problem that chip area efficiency is greatly reduced.

SUMMARY

Various embodiments are directed to an optical receiver capable of improving a bandwidth and reducing a chip area.

In an embodiment, there is provided an optical receiver including an optical receiver comprising a transimpedance amplifier that converts a current signal corresponding to an optical signal into a voltage signal, wherein the transimpedance amplifier comprises: an input terminal receiving the current signal; an output terminal outputting the voltage signal; an inverter including a pull-up device that pull-up drives the voltage signal of the output terminal according to the current signal, and a pull-down device that pull-down drives the voltage signal of the output terminal according to the current signal; a feedback resistor electrically connected between the input and output terminals; a first resistor electrically connected between the input terminal and the pull-up device; and a second resistor electrically connected between the input terminal and the pull-down device.

In an embodiment, there is provided an optical receiver including a photodetector that receives an optical signal and outputs a current signal corresponding to the received optical signal; a transimpedance amplifier that converts the current signal into a voltage signal; and a limiting amplifier that converts the voltage signal into differential data signals having a certain amplitude difference and includes cascaded multistage amplifiers, wherein a first amplifier of the multistage amplifiers comprises: first and second transistors that drive differential output terminals in response to signals of differential input terminals; and resistors that divide a power supply voltage and provide divided power supply voltages to the first and second transistors, wherein the first amplifier shares one or more of the resistors with a second amplifier of the multistage amplifiers.

In an embodiment, there is provided an optical receiver including a limiting amplifier that converts an input signal into differential data signals having a certain amplitude difference and includes cascaded multistage amplifiers, wherein a first amplifier of the multistage amplifiers comprises: first and second transistors that drive differential output terminals in response to signals of differential input terminals; first and second load resistor branches that divide a power supply voltage and supply a first divided power supply voltage to the first transistor; and third and fourth load resistor branches that divide the power supply voltage and supply a second divided power supply voltage to the second transistor, wherein the first to fourth load resistor branches include first to fourth nodes, respectively, and one or more of the first to fourth nodes are connected to a second amplifier of the multistage amplifiers.

According to embodiments of the present disclosure, it is possible to remove an inductor that occupies most of a chip area in a transimpedance amplifier and a limiting amplifier of an optical receiver, so that it is possible to significantly reduce the chip area.

Furthermore, according to embodiments of the present disclosure, it is possible to adjust a position and a gain of a zero point by using a ratio of a resistance value of a feedback resistor to a resistance value of a gate resistor of the transimpedance amplifier, thereby improving a bandwidth of the transimpedance amplifier.

Furthermore, according to embodiments of the present disclosure, it is possible to adjust characteristics of a filter using a time delay value and a resistance dividing ratio between multistage amplifiers of the limiting amplifier, thereby improving a bandwidth of the limiting amplifier.

DETAILED DESCRIPTION

Figure 1:
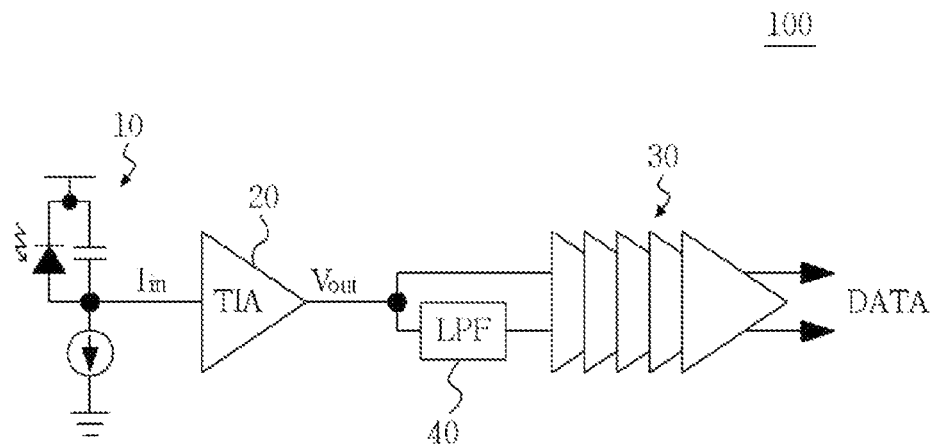
FIG. 1 illustrates an optical receiver according to an embodiment of the present disclosure.

Various embodiments will be described below in more detail with reference to the accompanying drawings such that the present invention can be easily embodied by those skilled in the art to which the present invention pertains. Throughout the disclosure, like reference numerals refer to like parts throughout the various figures and embodiments of the present invention.

Moreover, detailed descriptions related to well-known functions or configurations will be ruled out in order not to unnecessarily obscure subject matters of the present invention.

The terms such as 'first' and 'second' may be used to describe various components, but the components are not limited by the terms, and the terms are used only to distinguish one component from another component.

FIG. 1 illustrates an optical receiver 100 according to an embodiment of the present disclosure.

Referring to FIG. 1, the optical receiver 100 includes a photodetector 10, a transimpedance amplifier 20, a low pass filter 40, and a limiting amplifier 30.

The photodetector 10 detects an optical signal transmitted from an optical transmitter (not illustrated), converts the detected optical signal into an electrical signal, e.g., a current signal Iin, and transmits the current signal Iin to the transimpedance amplifier 20. For example, the photodetector 10 may include a photodiode, a laser diode, or the like.

The transimpedance amplifier 20 converts the current signal Iin transmitted from the photodetector 10 into a voltage signal Vout, and transmits the voltage signal Vout to the limiting amplifier 30 and the low pass filter 40. Such a transimpedance amplifier 20 may be implemented with an inverter for the purpose of a high speed operation.

The limiting amplifier 30 is a circuit that converts a voltage signal having a small swing into a voltage signal having a large swing. The limiting amplifier 30 converts the voltage signal Vout of the transimpedance amplifier 20 into differential data signals DATA having a certain amplitude difference therebetween, and provides the differential data signals DATA to a data recovery circuit (not illustrated). Such a limiting amplifier may be implemented with serially connected multistage amplifiers each of which has a small voltage gain.

The low pass filter 40 filters a high frequency component and noise of the voltage signal Vout transmitted from the transimpedance amplifier 20, and provides the filtered voltage signal to one of differential input terminals of the limiting amplifier 30. The filtered voltage signal may be used to remove a DC offset error between the differential data signals DATA.

Figure 2:
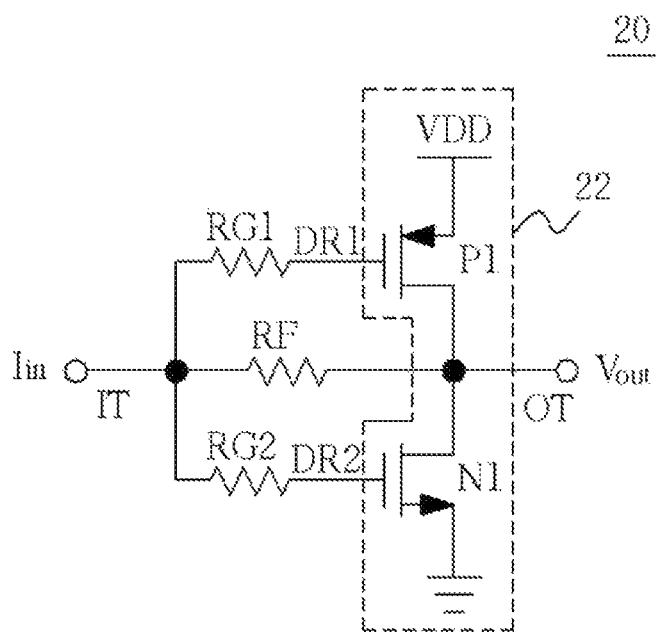
FIG. 2 is a circuit diagram of a transimpedance amplifier illustrated in FIG. 1 according to an embodiment of the present disclosure.

FIG. 2 is a circuit diagram of the transimpedance amplifier 20 illustrated in FIG. 1. For the convenience of description, it is assumed that a transistor included in the transimpedance amplifier 20 is a metal oxide semiconductor field effect transistor (MOSFET). The transistor is just an example and another transistor, such as a bipolar junction transistor (BJT), may be used for design.

Referring to FIG. 2, the transimpedance amplifier 20 is implemented with an inverter for the purpose of a high speed operation. Such a transimpedance amplifier 20 includes an inverter 22, a feedback resistor RF, and first and second gate resistors RG1 and RG2.

The inverter 22 includes a pull-up device P1 and a pull-down device N1. The pull-up device P1 may include a PMOS transistor, and the pull-down device N1 may include an NMOS transistor. The pull-up device P1 pull-up drives the voltage signal Vout of an output terminal OT, and the pull-down device N1 pull-down drives the voltage signal Vout of the output terminal OT. The pull-up device P1 has a source to which a power supply voltage (VDD) terminal is electrically connected, a gate to which the first gate resistor RG1 is electrically connected, and a drain to which the output terminal OT is electrically connected. The pull-down device N1 has a source to which a ground voltage (GND) terminal is electrically connected, a gate to which the second gate resistor RG2 is electrically connected, and a drain to which the output terminal OT is electrically connected.

The feedback resistor RF may be electrically connected between an input terminal IT and the output terminal OT of the transimpedance amplifier 20 and have a resistance value that is larger than those of the first and second gate resistors RG1 and RG2. Such a feedback resistor RF may apply a bias voltage to the pull-up device P1 and the pull-down device N1 by suppressing an AC voltage and transferring a DC voltage. For example, when the pull-up device P1 and the pull-down device N1 have substantially the same performance, the bias voltage may be a half of a power supply voltage VDD.

The first gate resistor RG1 is electrically connected between the input terminal IT and the gate of the pull-up device P1. The second gate resistor RG2 is electrically connected between the input terminal IT and the gate of the pull-down device N1. The first and second gate resistors RG1 and RG2 are set to have a same resistance value. The first gate resistor RG1 transfers a first driving signal DR1 to the gate of the pull-up device P1, and the second gate resistor RG2 transfers a second driving signal DR2 to the gate of the pull-down device N1.

The pull-up device P1 drives the voltage signal Vout of the output terminal OT with the power supply voltage VDD in response to the first driving signal DR1, and the pull-down device N1 drives the voltage signal Vout of the output terminal OT with the ground voltage GND in response to the second driving signal DR2. Voltage levels of the first and second driving signals DR1 and DR2 may be decided based on the current signal Iin applied to the input terminal IT, the bias voltage applied by the feedback resistor RF, and the resistance values of the first and second gate resistors RG1 and RG2.

Since the pull-up device P1 and the pull-down device N1 are turned on or turned off in response to the first and second driving signals DR1 and DR2, respectively, a ratio of the voltage signal Vout to the current signal Iin may be decided according to the magnitude of the current signal Iin and the resistance values of the feedback resistor RF and the first and second gate resistors RG1 and RG2, which decide the voltage levels of the first and second driving signals DR1 and DR2. As a consequence, a gain and a bandwidth of the transimpedance amplifier 20 can be determined by adjusting a resistance ratio of the resistance value of the feedback resistor RF to a resistance value of a gate resistor RG. The gate resistor RG may correspond to any of the first and second gate resistors RG1 and RG2 having the same resistance value.

Figure 3:
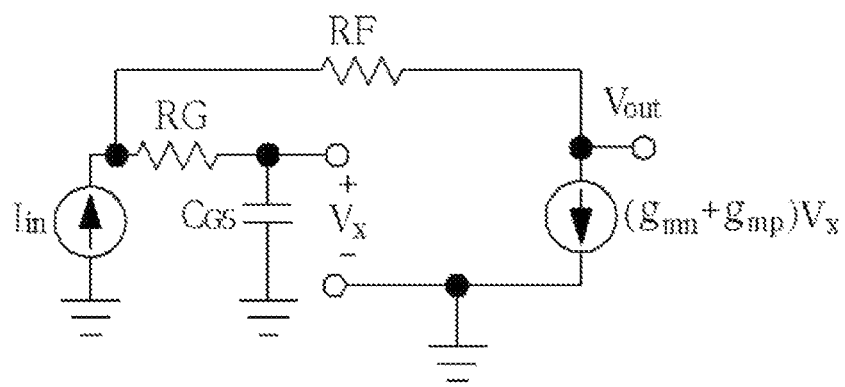
FIG. 3 is a circuit diagram obtained by modeling the transimpedance amplifier illustrated in FIG. 2 using small signals.

FIG. 3 is a circuit diagram obtained by modeling the transimpedance amplifier 20 illustrated in FIG. 2 using small signals.

When the transimpedance amplifier 20 shown in FIG. 2 is analyzed through small signal modeling as illustrated in FIG. 3, it can be understood that a zero point is newly generated in front of a pole by a gate resistor RG and this is similar to the effect of an inductor. The position of the zero point can be adjusted at a resistance ratio of the feedback resistor RF to the gate resistor RG, and the bandwidth of the transimpedance amplifier 20 can be increased without using an inductor.

The following Equation 1 to Equation 3 are obtained by analyzing the small signal model of the transimpedance amplifier 20 and represent a process for calculating the gain of the transimpedance amplifier 20, thereby proving that the gate resistor RG is added to constitute an active inductor.

$$sC_{gs}V_x = I_{in} - g_m V_x \quad \text{Equation 1}$$

$$V_x = \frac{1}{sC_{gs} + g_m} I_{in}$$

$$V_{out} = V_x + R_G(sC_{gs}V_x) - R_F g_m V_x$$
$$= V_x(1 + sC_{gs}R_G - R_F g_m)$$
$$= \frac{1}{sC_{gs} + g_m} I_{in}(1 + sC_{gs}R_G - R_F g_m)$$

$$\frac{I_{in}}{V_{out}} = \frac{1}{R_T} = \frac{sC_{gs} + g_m}{1 + sC_{gs}R_G - R_F g_m} \quad \text{Equation 2}$$

$$= \frac{sC_{gs} + \frac{1}{R_G} - \frac{R_F}{R_G}g_m + g_m - \frac{1}{R_G} + \frac{R_F}{R_G}g_m}{1 + sC_{gs}R_G - R_F g_m}$$

$$= \frac{1}{R_G} + \frac{g_m - \frac{1}{R_G} + \frac{R_F}{R_G}g_m}{1 + sC_{gs}R_G - R_F g_m}$$

$$= \frac{1}{R_G} + \frac{1}{s\frac{C_{gs}R_G^2}{g_m(R_F + R_G) - 1} + \frac{R_G - R_F R_G g_m}{g_m(R_F + R_G) - 1}}$$

$$R_P = \frac{1}{R_G} \quad \text{Equation 3}$$

$$L_S = s\frac{C_{gs}R_G^2}{g_m(R_F + R_G) - 1}$$

$$R_S = \frac{R_G - R_F R_G g_m}{g_m(R_F + R_G) - 1}$$

In Equations 1 to 3, $R_G$ represents a resistance value of the gate resistor RG; $R_F$ represents a resistance value of the feedback resistor RF; $C_{gs}$ represents a capacitance value of a capacitor $C_{GS}$; Vx represents a voltage applied to the capacitor $C_{GS}$; $g_m$ represents a mutual conductance of a MOSFET of the transimpedance amplifier 20; Rp represents an electric resistance of the transimpedance amplifier 20; Ls represents an inductive load of the transimpedance amplifier 20; and Rs represents a capacitive load of the transimpedance amplifier 20.

As expressed by Equation 1 and Equation 2 above, the gain and the bandwidth of the transimpedance amplifier 20 can be determined by adjusting the resistance ratio of the feedback resistor RF to the gate resistor RG.

Figure 4:
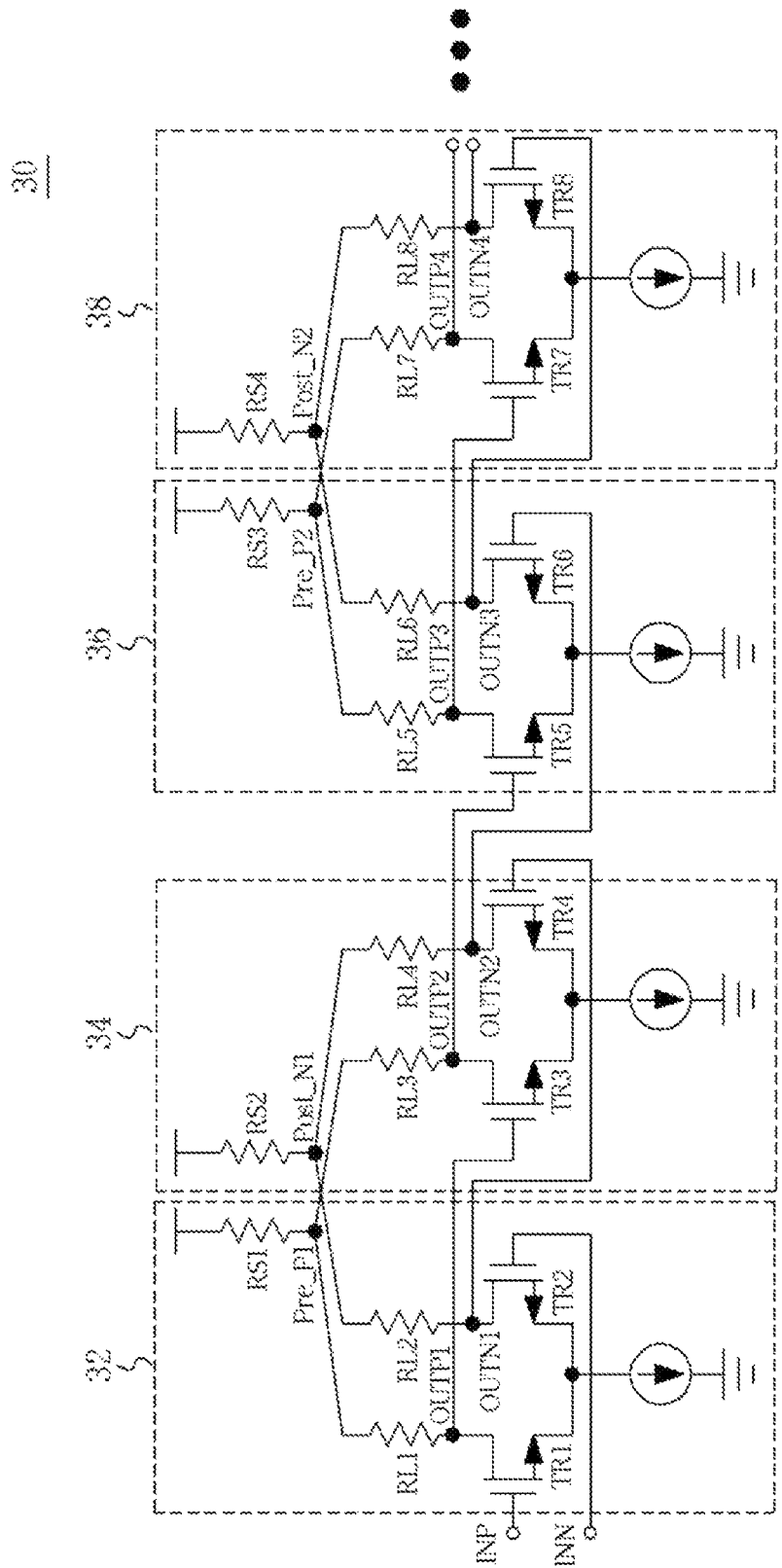
FIG. 4 is a circuit diagram of a limiting amplifier illustrated in FIG. 1 according to an embodiment of the present disclosure.

FIG. 4 is a circuit diagram of the limiting amplifier 30 illustrated in FIG. 1 according to an embodiment.

Referring to FIG. 4, the limiting amplifier 30 includes cascaded multistage amplifiers. For the convenience of description, FIG. 4 illustrates first to fourth amplifiers 32, 34, 36, and 38 among the cascaded multistage amplifiers.

The limiting amplifier 30 converts the voltage signal Vout of the transimpedance amplifier 20 into the differential data signals DATA having a certain amplitude difference by using the first to fourth amplifiers 32, 34, 36, and 38.

In the limiting amplifier 30, the neighboring first and second amplifiers 32 and 34 share first and second sharing resistors RS1 and RS2, and the neighboring third and fourth amplifiers 36 and 38 share third and fourth sharing resistors RS3 and RS4. In the aforementioned configuration, the neighboring first and second amplifiers 32 and 34 share a resistance value divided at a certain ratio at the same nodes Pre_P1 and Post_N1, and the neighboring third and fourth amplifiers 36 and 38 share a resistance value divided at a certain ratio at the same nodes Pre_P2 and Post_N2.

Each of the first to fourth sharing resistors RS1 to RS4 may have a resistance value aR, and each of the first to eighth load resistors RL1 to RL8 may have a resistance value $(1-\alpha)R$. The $\alpha$ may be defined as a resistance dividing ratio that is set in advance.

As described above, the present embodiment configures the limiting amplifier 30 by using a point at which resistors of neighboring amplifiers are shared at a certain ratio in order to replace the use of an inductor, and a time delay occurs by passing through the first to fourth amplifiers 32, 34, 36, and 38.

With reference to FIG. 4, the configuration of the first to fourth amplifiers 32, 34, 36, and 38 of the limiting amplifier 30 will be described as follows.

The first amplifier 32 includes the first sharing resistor RS1 electrically connected to a power supply voltage terminal, the first load resistor RL1 electrically connected to the first sharing resistor RS1, and the second load resistor RL2 electrically connected to the second sharing resistor RS2 that is included in the second amplifier 34. The first amplifier 32 further includes a first transistor TR1 and a second transistor TR2. The first transistor TR1 receives a voltage, which is obtained by dividing a power supply voltage with the first sharing resistor RS1 and the first load resistor RL1, and drives a first positive output terminal OUTP1 in response to a signal of a positive input terminal INP. The second transistor TR2 receives a voltage which is obtained by dividing the power supply voltage with the second sharing resistor RS2 included in the second amplifier 34 and the second load resistor RL2, and drives a first negative output terminal OUTN1 in response to a signal of a negative input terminal INN.

The second amplifier 34 includes the second sharing resistor RS2 electrically connected to the power supply voltage terminal, the third load resistor RL3 electrically connected to the first sharing resistor RS1 included in the first amplifier 32, and the fourth load resistor RL4 electrically connected to the second sharing resistor RS2. The second amplifier 34 further includes a third transistor TR3 and a fourth transistor TR4. The third transistor TR3 receives a voltage that is obtained by dividing the power supply voltage with the first sharing resistor RS1 included in the first amplifier 32 and the third load resistor RL3, and drives a second positive output terminal OUTP2 in response to a signal of the first positive output terminal OUTP1 of the first amplifier 32. The fourth transistor TR4 receives a voltage that is obtained by dividing the power supply voltage with the second sharing resistor RS2 and the fourth load resistor RL4, and drives a signal of a second negative output terminal OUTN2 in response to a signal of the first negative output terminal OUTN1 of the first amplifier 32.

The third amplifier 36 includes the third sharing resistor RS3 electrically connected to the power supply voltage terminal, the fifth load resistor RL5 electrically connected to the third sharing resistor RS3, and the sixth load resistor RL6 electrically connected to the fourth sharing resistor RS4 included in the fourth amplifier 38. The third amplifier 36 further includes a fifth transistor TR5 and a sixth transistor TR6. The fifth transistor TR5 receives a voltage that is obtained by dividing the power supply voltage with the third sharing resistor RS3 and the fifth load resistor RL5, and drives a signal of a third positive output terminal OUTP3 in response to a signal of the second positive output terminal OUTP2. The sixth transistor TR6 receives a voltage that is obtained by dividing the power supply voltage with the fourth sharing resistor RS4 included in the fourth amplifier 38 and the sixth load resistor RL6, and drives a signal of a third negative output terminal OUTN3 in response to a signal of the second negative output terminal OUTN2.

The fourth amplifier 38 includes the fourth sharing resistor RS4 electrically connected to the power supply voltage terminal, the seventh load resistor RL7 electrically connected to the third sharing resistor RS3 included in the third amplifier 36, and the eighth load resistor RL8 electrically connected to the fourth sharing resistor RS4. The fourth amplifier 38 further includes a seventh transistor TR7 and an eighth transistor TR8. The seventh transistor TR7 receives a voltage that is obtained by dividing the power supply voltage with the third sharing resistor RS3 included in the third amplifier 36 and the seventh load resistor RL7, and drives a signal of a fourth positive output terminal OUTP4 in response to a signal of the third positive output terminal OUTP3 of the third amplifier 36. The eighth transistor TR8 receives a voltage that is obtained by dividing the power supply voltage with the fourth sharing resistor RS4 and the eighth load resistor RL8, and drives a signal of a fourth negative output terminal OUTN4 in response to a signal of the third negative output terminal OUTN3 of the third amplifier 36.

In this embodiment, characteristics of the limiting amplifier 30, such as a gain, a bandwidth, and the like, may be set according to a time delay value td and a resistance dividing ratio α among the first to fourth amplifiers 32, 34, 36, and 38. The time delay value td represents a time delay occurring in one amplifier stage of the limiting amplifier 30.

Figure 5:
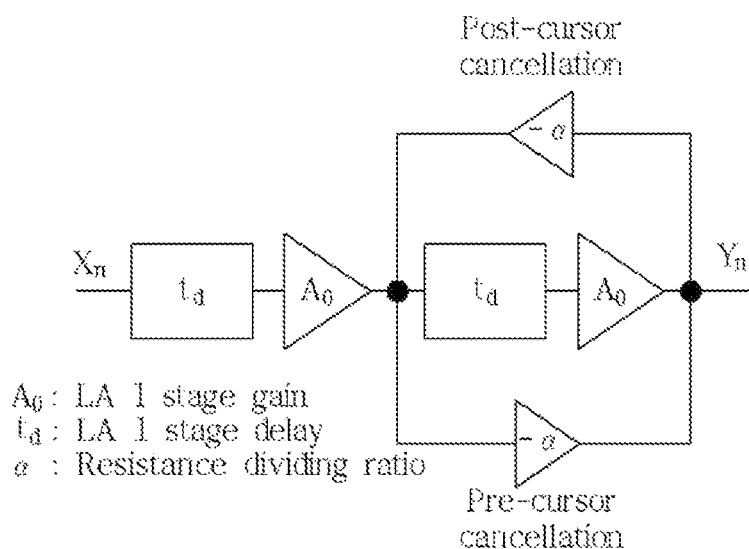
FIG. 5 is a block diagram obtained by modeling the limiting amplifier illustrated in FIG. 4.

FIG. 5 is a block diagram obtained by modeling the limiting amplifier 30 illustrated in FIG. 4.

Referring to FIG. 5, when the limiting amplifier 30 is analyzed based on a unit cell including two of the multistage amplifiers, pre-cursor cancellation and post-cursor cancellation occur once.

The following Equation 4 is obtained by analyzing a modeled infinite impulse response (IIR) filter.

$$y(t) = A_0[A_0 x(t - 2td) - \alpha y(t - td)] - \alpha x(t)$$
$$Y(z) = A_0^2 X(z) e^{-i4\pi f t_d} - A_0 \alpha Y(z) e^{-i2\pi f t_d} - \alpha X(z)$$
$$Y(z)(1 + A_0 \alpha e^{-i2\pi f t_d}) = X(z)(A_0^2 e^{-i4\pi f t_d})$$
$$\frac{Y(z)}{X(z)} = H(z) = \frac{(A_0^2 e^{-i4\pi f t_d} - \alpha)}{(1 + A_0 \alpha e^{-i2\pi f t_d})}$$

Equation 4

In Equation 4 above, td denotes a time delay value of one amplifier stage, $A_0$ denotes a gain of the one amplifier stage, and α denotes a resistance dividing ratio.

According to the present embodiment, it is possible to adjust characteristics of a filter using a time delay value td and a resistance dividing ratio α between amplifier stages. It is very efficient in terms of a chip area because an inductor is not used to implement the amplifier stage. In addition, it is possible to design a limiting amplifier with a simple structure as compared with another complicated equalizing circuit.

Figure 6:
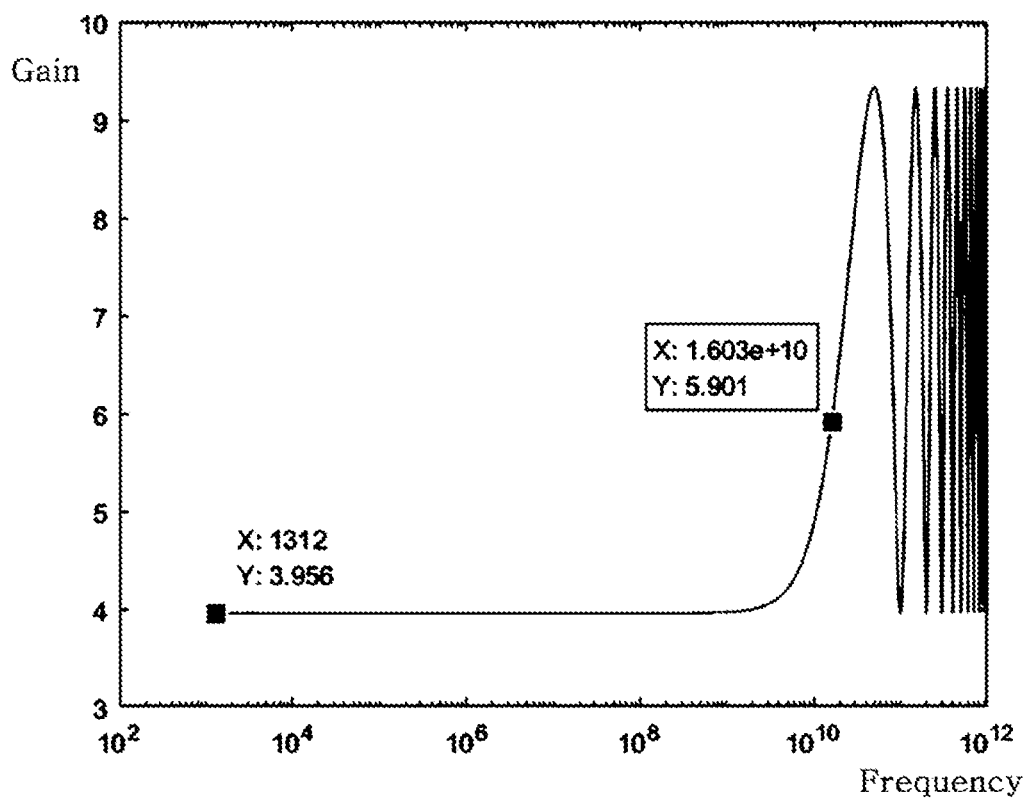
FIG. 6 is a graph obtained by analyzing the modeling of the limiting amplifier illustrated in FIG. 5.

FIG. 6 is a graph obtained by analyzing the modeling of the limiting amplifier illustrated in FIG. 5.

For example, FIG. 6 is obtained by analyzing the limiting amplifier by using a simulation tool when the time delay value td of one amplifier stage is 10 ps, the gain $A_0$ of the one amplifier stage is 1.5, and the resistance dividing ratio α is 0.2. When it is assumed that the limiting amplifier has been designed at 16 GHz and two neighboring amplifiers in the limiting amplifier share a resistor, there is an equalizing effect of 0.9725 dB/stage.

As described above, according to the present embodiment, it is possible to adjust the gain, the bandwidth, and the like of the limiting amplifier by adjusting the time delay value td and the resistance dividing ratio α between the multistage amplifiers.

Figure 7:
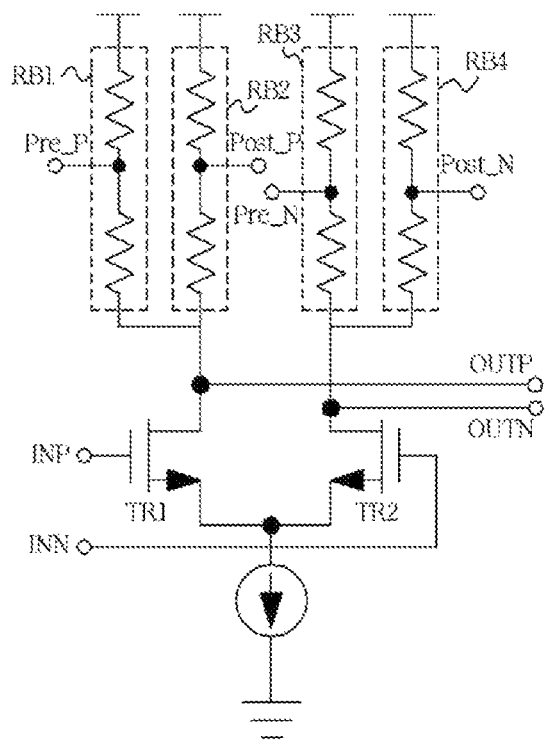
FIG. 7 is a circuit diagram illustrating one of multistage amplifiers of the limiting amplifier illustrated in FIG. 1 according to another embodiment of the present disclosure.

FIG. 7 is a circuit diagram illustrating one amplifier 32A in the limiting amplifier 30 illustrated in FIG. 1 according to another embodiment.

Referring to FIG. 7, the amplifier 32A includes first and second transistors TR1 and TR2 and current mode load resistors. The first and second transistors TR1 and TR2 drive differential output terminals OUTP and OUTN in response to signals of differential input terminals INP and INN, respectively. The current mode load resistors divide a power supply voltage. The current mode load resistors include two load resistor branches RB1 and RB2 electrically connected to the first transistor TR1 and two load resistor branches RB3 and RB4 electrically connected to the second transistor TR2.

The load resistor branches RB1, RB2, RB3, and RB4 respectively include first to forth nodes Pre_P, Post_P, Pre_N, and Post_N that divide the power supply voltage, wherein one or more of the first to forth nodes Pre_P, Post_P, Pre_N, and Post_N are shared by one or more other amplifiers each having a certain time delay. For example, resistance values of the load resistor branches RB1, RB2, RB3, and RB4 may be designed to be twice a resistance value of the limiting amplifier of FIG. 4 in order to keep the same impedance value as the amplifier of FIG. 4.

In an embodiment using the amplifier shown in FIG. 7, pre-cursor cancellation and post-cursor cancellation may occur for each amplifier stage differently from the structures of FIG. 4 and FIG. 5 in which the pre-cursor cancellation and the post-cursor cancellation occur for each unit cell including two amplifier stages, and a load resistor may be shared by amplifier stages that are not neighboring. In another embodiment, a load resistor may be shared by amplifier stages that are neighboring. A delayed time can be adjusted according to the number of amplifier stages existing between amplifier stages sharing a load resistor.

Figure 8:
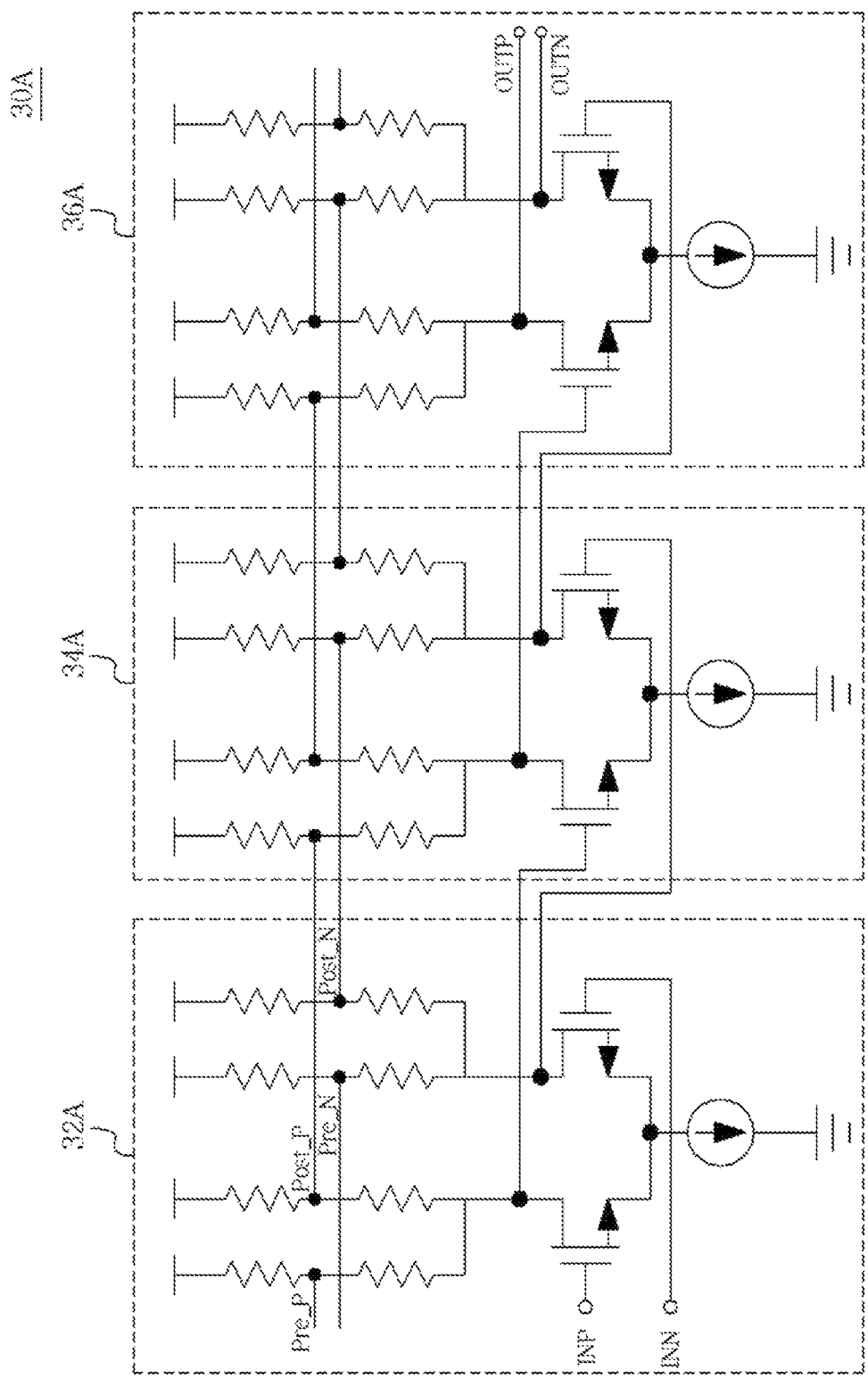
FIG. 8 is a circuit diagram of a limiting amplifier using the amplifier of FIG. 7 according to another embodiment of the present disclosure.
Figure 9:
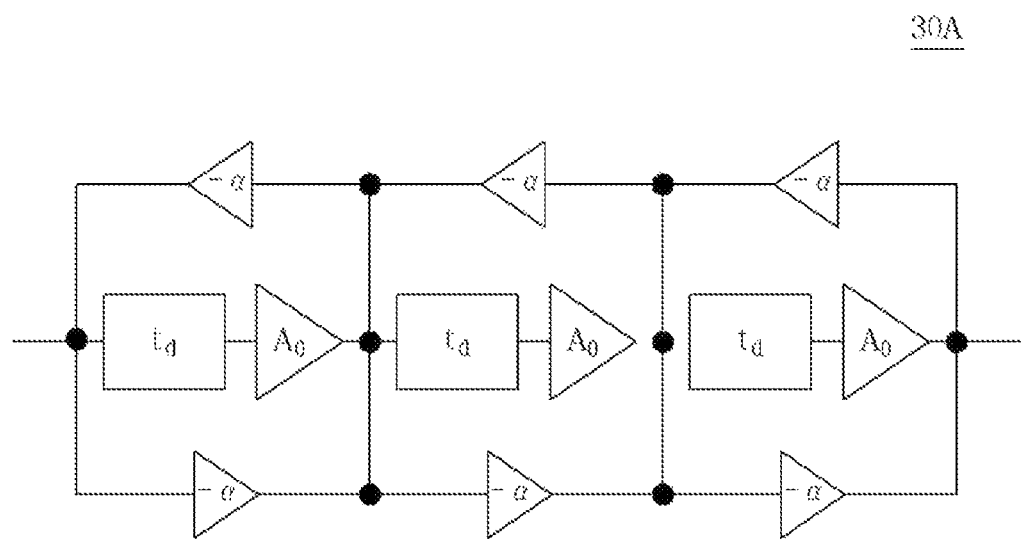
FIG. 9 is a block diagram obtained by modeling the limiting amplifier illustrated in FIG. 8.

FIG. 8 is a circuit diagram of a limiting amplifier 30A using the amplifier 32A of FIG. 7 and FIG. 9 is a block diagram obtained by modeling the limiting amplifier 30A illustrated in FIG. 8.

Referring to FIG. 8 and FIG. 9, the limiting amplifier 30A may include first to third amplifiers 32A, 34A, and 36A. According to an embodiment, neighboring first and second amplifiers 32A and 34A may be designed to share load resistor branches, and neighboring second and third amplifiers 34A and 36A may be designed to share load resistor branches. Further, according to another embodiment, the limiting amplifier 30A can be designed such that a resistor is shared with a time difference of one amplifier stage. That is, there is one amplifier stage between two amplifier stages sharing the resistor. According to such embodiments, since pre-cursor and post-cursor cancellation occur for each amplifier stage, an equalizing frequency of the limiting amplifier 30A is higher than that of the embodiment of FIG. 4, so that it is possible to improve equalizing.

Furthermore, the embodiment shown in FIGS. 8 and 9 illustrates a case where load resistor branches for dividing the power supply voltage are shared with a time difference of one amplifier stage, but embodiments are not limited thereto. In other embodiments, a limiting amplifier can be designed such that load resistor branches are shared with a time difference of two amplifier stages, or a limiting amplifier can be designed such that load resistor branches are shared with a time difference of three amplifier stages, by using the limiting amplifier 32A illustrated in FIG. 7.

Although various embodiments of the present disclosure have been described for illustrative purposes, those skilled in the art will appreciate that various modifications, additions, and substitutions are possible, without departing from the scope and the spirit of the invention as disclosed in the accompanying claims.

While various embodiments have been described above, it will be understood to those skilled in the art that the embodiments described are by way of example only. Accordingly, the disclosure described herein should not be limited based on the described embodiments.

What is claimed is:

1. An optical receiver comprising a transimpedance amplifier that converts a current signal corresponding to an optical signal into a voltage signal, wherein the transimpedance amplifier comprises:
   an input terminal receiving the current signal;
   an output terminal outputting the voltage signal;
   an inverter including a pull-up transistor that pull-up drives the voltage signal of the output terminal according to the current signal, and a pull-down transistor that pull-down drives the voltage signal of the output terminal according to the current signal;
   a feedback resistor electrically connected between the input terminal and the output terminal;
   a first resistor electrically connected between the input terminal and the pull-up transistor; and
   a second resistor electrically connected between the input terminal and the pull-down transistor.

2. The optical receiver according to claim 1, wherein a gain and a bandwidth of the transimpedance amplifier are determined according to a ratio of a resistance value of the feedback resistor to resistance values of the first resistor and the second resistor.

3. The optical receiver according to claim 2, wherein the feedback resistor has a resistance value larger than the resistance values of the first resistor and the second resistor, and
   wherein the first resistor and the second resistor have a same resistance value.

4. The optical receiver according to claim 1, wherein the pull-up transistor pull-up drives the voltage signal of the output terminal in response to a first driving signal applied by the first resistor, and
   wherein the pull-down transistor pull-down drives the voltage signal of the output terminal in response to a second driving signal applied by the second resistor.

5. The optical receiver according to claim 4, wherein voltage levels of the first driving signal and the second driving signal are decided by a magnitude of the current signal, resistance values of the first resistor and the second resistor, and a bias voltage applied to the pull-up transistor and the pull-down transistor.

6. The optical receiver according to claim 5, wherein the feedback resistor applies the bias voltage to the pull-up transistor and the pull-down transistor.

7. The optical receiver according to claim 1, wherein the pull-up transistor has a source to which a power supply voltage terminal is electrically connected, a gate to which the first resistor is electrically connected, and a drain to which the output terminal is electrically connected, and
   wherein the pull-down transistor has a source to which a ground voltage terminal is electrically connected, a gate to which the second resistor is electrically connected, and a drain to which the output terminal is electrically connected.

8. The optical receiver according to claim 1, further comprising a photodetector that receives the optical signal and outputs the current signal corresponding to the received optical signal to the transimpedance amplifier.

9. An optical receiver comprising:
   a photodetector that receives an optical signal and outputs a current signal corresponding to the received optical signal;
   a transimpedance amplifier that converts the current signal into a voltage signal; and
   a limiting amplifier that converts the voltage signal into differential data signals having an amplitude difference and includes cascaded multistage amplifiers,
   wherein a first amplifier of the multistage amplifiers comprises:
   a first transistor and a second transistor that drive differential output terminals in response to signals of differential input terminals; and
   resistors that divide a power supply voltage and provide divided power supply voltages to the first transistor and the second transistor,
   wherein the first amplifier shares one or more of the resistors with a second amplifier of the multistage amplifiers.

10. The optical receiver according to claim 9, wherein the first amplifier and the second amplifier sharing the one or more of the resistors are neighboring in the limiting amplifier.

11. The optical receiver according to claim 9, wherein the the first amplifier and the second amplifier sharing the one or more of the resistors have a time delay therebetween in the limiting amplifier.

12. The optical receiver according to claim 9, wherein a gain and a bandwidth of the limiting amplifier are set according to a time delay value between the multistage amplifiers and a resistance value that is shared by the first amplifier and the second amplifier at a constant ratio.

13. The optical receiver according to claim 9, wherein the first amplifier comprises:
   a first sharing resistor to which the power supply voltage is applied;
   a first load resistor electrically connected to the first sharing resistor;
   a second load resistor electrically connected to a second sharing resistor included in the second amplifier;
   the first transistor having a drain electrically connected to the first load resistor, a gate to which the voltage signal is applied, and a source to which a ground voltage is applied; and
   the second transistor having a drain electrically connected to the second load resistor, a gate to which the voltage signal is applied, and a source to which the ground voltage is applied.

14. The optical receiver according to claim 13, wherein the second amplifier comprises:
- the second sharing resistor to which the power supply voltage is applied;
- a third load resistor electrically connected to the first sharing resistor included in the first amplifier;
- a fourth load resistor electrically connected to the second sharing resistor;
- a third transistor having a drain electrically connected to the third load resistor, a gate to which a first output signal of the first amplifier is applied, and a source to which the ground voltage is applied; and
- a fourth transistor having a drain electrically connected to the fourth load resistor, a gate to which a second output signal of the first amplifier is applied, and a source to which the ground voltage is applied.

15. An optical receiver comprising:
- a limiting amplifier that converts an input signal into differential data signals having an amplitude difference and includes cascaded multistage amplifiers,
- wherein a first amplifier of the multistage amplifiers comprises:
- a first transistor and a second transistor that drive differential output terminals in response to signals of differential input terminals;
- a first load resistor branch and a second load resistor branch that divide a power supply voltage and supply a first divided power supply voltage to the first transistor; and
- a third load resistor branch and a fourth load resistor branch that divide the power supply voltage and supply a second divided power supply voltage to the second transistor,
- wherein the first load resistor branch to the fourth load resistor branch include a first node to a fourth node, respectively, and one or more of the first node to the fourth node are connected to a second amplifier of the multistage amplifiers.

16. The optical receiver according to claim 15, wherein the first amplifier and the second amplifier have a time delay therebetween.

17. The optical receiver according to claim 15, wherein a gain and a bandwidth of the limiting amplifier are set according to a time delay value between the multistage amplifiers and a resistance value that is shared by the first amplifier and the second amplifier at a constant ratio.

18. The optical receiver according to claim 15, wherein one or more of the first node to the fourth node are connected to a third amplifier of the multistage amplifiers, the one or more of the first node to the fourth node connected to the second amplifier being different from the one or more of the first node to the fourth node connected to the third amplifier.

19. The optical receiver according to claim 18, wherein in the first amplifier,
- each of the first load resistor branch and the second load resistor branch includes two resistors that are serially connected between a power supply voltage terminal and the first transistor,
- each of the third load resistor branch and the fourth load resistor branch includes two resistors that are serially connected between the power supply voltage terminal and the second transistor,
- a common node of the two resistors in the first load resistor branch corresponds to the first node,
- a common node of the two resistors in the second load resistor branch corresponds to the second node,
- a common node of the two resistors in the third load resistor branch corresponds to the third node, and
- a common node of the two resistors in the fourth load resistor branch corresponds to the fourth node.

20. The optical receiver according to claim 19, wherein the second amplifier and the third amplifier have same configuration as that of the first amplifier, and
- wherein the first node and the third node of the first amplifier are connected to a second node and a fourth node of the third amplifier, and the second node and the fourth node of the first amplifier are connected to a first node and a third node of the second amplifier.

* * * * *